United States Patent
Cheng et al.

(10) Patent No.: US 8,884,299 B2
(45) Date of Patent: Nov. 11, 2014

(54) PIXEL STRUCTURE OF DISPLAY PANEL

(71) Applicant: AU Optronics Corp., Hsin-Chu (TW)

(72) Inventors: Wei-Cheng Cheng, Hsin-Chu (TW);
Kuan-Yu Chen, Hsin-Chu (TW);
Tien-Lun Ting, Hsin-Chu (TW);
Wen-Hao Hsu, Hsin-Chu (TW)

(73) Assignee: AU Optronics Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 13/975,367

(22) Filed: Aug. 25, 2013

(65) Prior Publication Data
US 2014/0203302 A1 Jul. 24, 2014

(30) Foreign Application Priority Data
Jan. 23, 2013 (TW) .............................. 102102468 A (51) Int. Cl.
*H01L 29/12* (2006.01)
*H01L 27/12* (2006.01)

(52) U.S. Cl.
CPC .................................. *H01L 27/1255* (2013.01)
USPC .............................................. 257/71; 349/38

(58) Field of Classification Search
CPC .......... G02F 1/133371; G02F 1/13624; G02F 1/136213; G02F 1/134363
USPC ................................................ 257/71; 349/38
See application file for complete search history.

(56) References Cited

U.S. PATENT DOCUMENTS

| | | | |
|---|---|---|---|
| 2010/0207856 A1* | 8/2010 | Jung et al. | 345/87 |
| 2011/0199568 A1 | 8/2011 | Morishita | |
| 2011/0285689 A1* | 11/2011 | Kim et al. | 345/211 |
| 2012/0008058 A1* | 1/2012 | Kim et al. | 349/41 |

* cited by examiner

*Primary Examiner* — Trung Q Dang
(74) *Attorney, Agent, or Firm* — Winston Hsu; Scott Margo (57) ABSTRACT

A pixel structure of a display panel includes a gate line, a first data line, a second data line, a first active switching device, a second active switching device, a first pixel electrode and a second pixel electrode. The first pixel electrode is electrically connected to the first active switching device. The first pixel electrode includes a first main electrode disposed adjacent to one side of the first data line, and a second main electrode disposed adjacent to one side of the second data line. The second pixel electrode is electrically connected to the second active switching device. The second pixel electrode is disposed between the first main electrode and the second main electrode of the first pixel electrode.

17 Claims, 5 Drawing Sheets

PIXEL STRUCTURE OF DISPLAY PANEL

BACKGROUND OF THE INVENTION

1. Field of the Invention

The present disclosure relates to a pixel structure of a display panel, and more particularly, to a pixel structure of a display panel with even and balanced parasitic capacitor effects.

2. Description of the Prior Art

As liquid crystal display related technologies are developed flourishingly, liquid crystal display panels have been widely used in all kinds of electronic products, for example, a flat-screen television, a notebook, a mobile phone and all kinds of consumer electronics. However, the narrow viewing angle of the conventional liquid crystal display panels hinders the technical evolution of the liquid crystal display panels. Accordingly, an in-plane switching (IPS) liquid crystal display panel is thus developed. The main feature of the in-plane switching liquid crystal display panel is that liquid crystal molecules are driven by horizontal electric fields, thereby enlarging the viewing angle effectively. The pixel structure of the conventional in-plane switching liquid crystal display panel includes a gate line, a first data line, a second data line, a first active switching device, a second active switching device, a first pixel electrode and a second pixel electrode. The first pixel electrode is disposed on a side of the first data line and electrically connected to the first active switching device. The second pixel electrode is disposed on a side of the second data line and electrically connected to the second active switching device. The voltage difference between the first pixel electrode and the second pixel electrode generates the horizontal electric fields to drive the liquid crystal molecules. Parasitic capacitors are formed between the first pixel electrode and the first data line and between the first pixel electrode and the second data line respectively. Parasitic capacitors are also formed between the second pixel electrode and the first data line and between the second pixel electrode and the second data line respectively. However, because the first pixel electrode is disposed only on a side of the first data line, the capacitance of the parasitic capacitor between the first pixel electrode and the first data line is different from the capacitance of the parasitic capacitor between the first pixel electrode and the second data line. Similarly, because the second pixel electrode is disposed only on a side of the second data line, the capacitance of the parasitic capacitor between the second pixel electrode and the first data line is different from the capacitance of the parasitic capacitor between the second pixel electrode and the second data line. Therefore, the pixel structure of the conventional in-plane switching liquid crystal display panel has uneven parasitic capacitors, leading to issues, such as flicker or crosstalk.

SUMMARY OF THE INVENTION

It is one of the objectives of the disclosure to provide a pixel structure of a display panel with even and balanced parasitic capacitor effects.

An embodiment of the disclosure provides a pixel structure of a display panel including a gate line, a first data line, a second data line, a first active switching device, a second active switching device, a first pixel electrode and a second pixel electrode. The first active switching device includes a first gate electrode, a first source electrode and a first drain electrode. The first gate electrode is electrically connected to the gate line. the first source electrode is electrically connected to the first data line. The second active switching device includes a second gate electrode, a second source electrode and a second drain electrode. The second gate electrode is electrically connected to the gate line. The second source electrode is electrically connected to the second data line. The first pixel electrode is electrically connected to the first drain electrode of the first active switching device. The first pixel electrode includes a first main electrode and a second main electrode. The first main electrode is substantially disposed adjacently to a side of the first data line. The second main electrode is substantially disposed adjacently to a side of the second data line. The second pixel electrode is electrically connected to the second drain electrode of the second active switching device. The second pixel electrode is disposed between the first main electrode of the first pixel electrode and the second main electrode of the first pixel electrode.

Another embodiment of the disclosure provides a pixel structure of a display panel including a gate line, a first data line, a second data line, a first active switching device, a second active switching device, a first pixel electrode and a second pixel electrode. The first active switching device includes a first gate electrode, a first source electrode and a first drain electrode. The first gate electrode is electrically connected to the gate line. The first source electrode is electrically connected to the first data line. The second active switching device includes a second gate electrode, a second source electrode and a second drain electrode. The second gate electrode is electrically connected to the gate line. The second source electrode is electrically connected to the second data line. The first pixel electrode is electrically connected to the first drain electrode of the first active switching device. The first pixel electrode includes a first main electrode and a second main electrode. The first main electrode is substantially disposed adjacently to both the first active switching device and a side of a portion of the first data line. The second main electrode is substantially disposed adjacently to both the second active switching device and a side of a portion of the second data line. The second pixel electrode is electrically connected to the second drain electrode of the second active switching device. The second pixel electrode includes a third main electrode and a fourth main electrode. The third main electrode is substantially disposed adjacently to a side of the other portion of the first data line, which is away from the first active switching device. The fourth main electrode is substantially disposed adjacently to a side of the other portion of the second data line, which is away from the second active switching device.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present disclosure, features of the embodiments will be made in detail. The embodiments of the present disclosure are illustrated in the accompanying drawings with numbered elements. In addition, the terms such as "first" and "second" described in the present disclosure are used to distinguish different components or processes, which do not limit the sequence of the components or processes.

Figure 1:
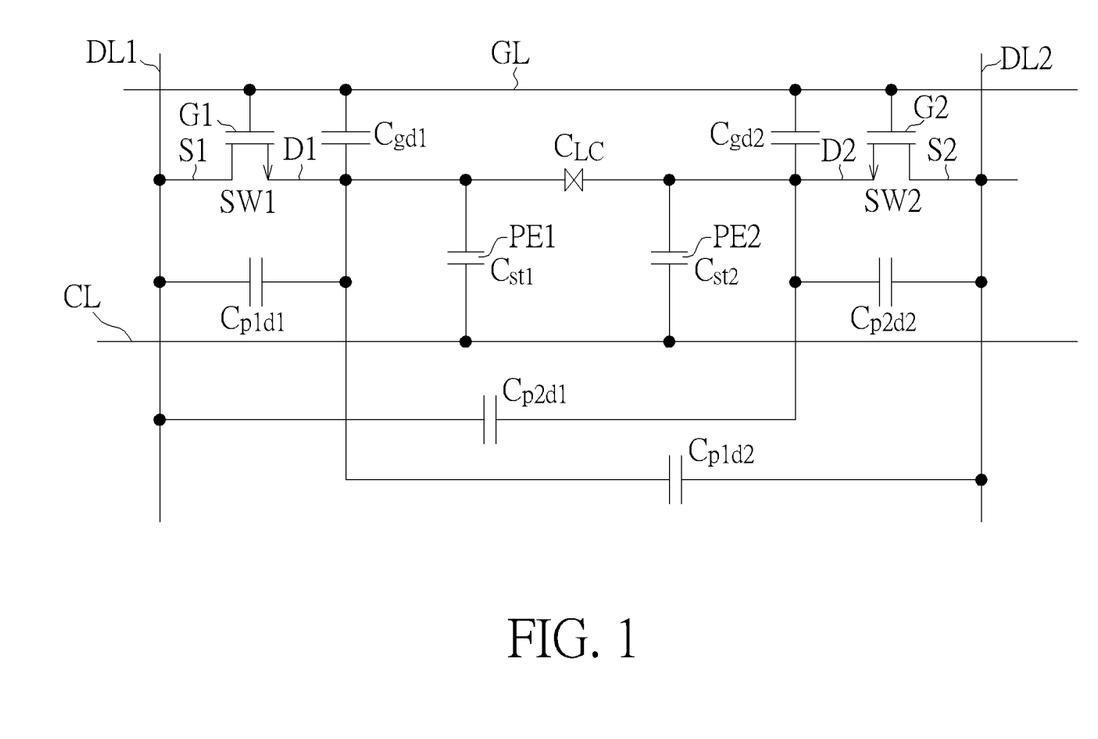
FIG. 1 is an equivalent circuit diagram of a pixel structure of a display panel of the present disclosure.

Please refer to FIG. 1. FIG. 1 is an equivalent circuit diagram of a pixel structure of a display panel of the present disclosure. As shown in FIG. 1, the pixel structure of the display panel in this embodiment includes a gate line GL, a first data line DL1, a second data line DL2, a storage capacitor line CL, a first active switching device SW1, a second active switching device SW2, a first pixel electrode PE1 and a second pixel electrode PE2. The first active switching device SW1 includes a first gate electrode G1, a first source electrode S1 and a first drain electrode D1. The first gate electrode G1 is electrically connected to the gate line GL. The first source electrode S1 is electrically connected to the first data line DL1. The second active switching device SW2 includes a second gate electrode G2, a second source electrode S2 and a second drain electrode D2. The second gate electrode G2 is electrically connected to the gate line GL. The second source electrode S2 is electrically connected to the second data line DL2. The first pixel electrode PE1 is electrically connected to the first drain electrode D1 of the first active switching device SW1. The second pixel electrode PE2 is electrically connected to the second drain electrode D2 of the second active switching device SW2. The gate line GL is employed to transmit gate signals to both the first gate electrode G1 and the second gate electrode G2 in order to switch on the first active switching device SW1 and the second active switching device SW2. When the first active switching device SW1 is turned on, the first data signals transmitted by the first data line DL1 will be sent to the first pixel electrode PE1 through the first source electrode S1 and the first drain electrode D1. When the second active switching device SW2 is turned on, the second data signals transmitted by the second data line DL2 will be sent to the second pixel electrode PE2 through the second source electrode S2 and the second drain electrode D2. The first active switching device SW1 and the second active switching device SW2 may be thin film transistor (TFT) devices respectively, but the present disclosure is not limited to this and can be other types of active switching devices.

The pixel structure of the display panel of the present disclosure further includes a liquid crystal capacitor $C_{LC}$, a first coupling capacitor $C_{gd1}$, a second coupling capacitor $C_{gd2}$, a first storage capacitor $C_{st1}$, a second storage capacitor $C_{st2}$, a first parasitic capacitor $C_{p1d1}$, a second parasitic capacitor $C_{p1d2}$, a third parasitic capacitor $C_{p2d1}$ and a fourth parasitic capacitor $C_{p2d2}$. The liquid crystal capacitor $C_{LC}$ is formed between the first pixel electrode PE1 and the second pixel electrode PE2 so as to drive liquid crystal molecules. To be more specifically, the horizontal electric field caused by the voltage difference between the first data signals of the first pixel electrode PE1 and the second data signals of the second pixel electrode PE2 can drive the liquid crystal molecules in order to control a gray level value of the display panel. The first coupling capacitor $C_{gd1}$ is formed between the first drain electrode D1 and the gate line GL. The second coupling capacitor $C_{gd2}$ is formed between the second drain electrode D2 and the gate line GL. The capacitance of the first coupling capacitor $C_{gd1}$ substantially equals the capacitance of the second coupling capacitor $C_{gd2}$. The first storage capacitor $C_{st1}$ is formed between the first drain electrode D1 (or the first pixel electrode PE1) and the storage capacitor line CL. The second storage capacitor $C_{st2}$ is formed between the second drain electrode D2 (or the second pixel electrode PE2) and the storage capacitor line CL. The capacitance of the first storage capacitor $C_{st1}$ substantially equals the capacitance of the second storage capacitor $C_{st2}$, but not limited thereto. The storage capacitor line CL has a common signal. The first data signals of the first pixel electrode PE1 and the second data signals of the second pixel electrode PE2 have opposite polarities with respect to the common signal of the storage capacitor line CL. For example, if the voltage of the first data signals of the first pixel electrode PE1 is higher than the voltage of the common signal of the storage capacitor line CL, the voltage of the second data signals of the second pixel electrode PE2 is lower than the voltage of the common signal of the storage capacitor line CL. Preferably, the voltage difference between the voltage of the first data signals of the first pixel electrode PE1 and the voltage of the common signal of the storage capacitor line CL substantially equals the voltage difference between the voltage of the second data signals of the second pixel electrode PE2 and the voltage of the common signal of the storage capacitor line CL, so the capacitance of the first storage capacitor $C_{st1}$ substantially equals the capacitance of the second storage capacitor $C_{st2}$. The first parasitic capacitor $C_{p1d1}$ is formed between the first pixel electrode PE1 and the first data line DL1. The second parasitic capacitor $C_{p1d2}$ is formed between the first pixel electrode PE1 and the second data line DL2. The third parasitic capacitor $C_{p2d1}$ is formed between the second pixel electrode PE2 and the first data line DL1. The fourth parasitic capacitor $C_{p2d2}$ is formed between the second pixel electrode PE2 and the second data line DL2.

The first parasitic capacitor $C_{p1d1}$, the second parasitic capacitor $C_{p1d2}$, the third parasitic capacitor $C_{p2d1}$ and the fourth parasitic capacitor $C_{p2d2}$ are formed because of the capacitive coupling effect between the pixel electrodes and the data lines. If the capacitance of the first parasitic capacitor $C_{p1d1}$, the capacitance of the second parasitic capacitor $C_{p1d2}$, the capacitance of the third parasitic capacitor $C_{p2d1}$ and the capacitance of the fourth parasitic capacitor $C_{p2d2}$ are not even and balanced, issues, such as flicker or crosstalk, occur on the screen and the display quality is damaged. Accordingly, the pixel electrodes in the pixel structure of the display panel of the present disclosure is designed to balance the capacitance of the first parasitic capacitor $C_{p1d1}$, the capacitance of the second parasitic capacitor $C_{p1d2}$, the capacitance of the third parasitic capacitor $C_{p2d1}$ and the capacitance of the fourth parasitic capacitor $C_{p2d2}$, so the issues, such as flicker or crosstalk, can be avoided effectively, the aperture ratio increases, and the display quality is enhanced. Each embodiment in the present disclosure is exemplarily embodied as a vertical alignment in-plane switching (VA-IPS) liquid crystal display panel, but the display panel in the present disclosure can be all kinds of liquid crystal display panels driven by horizontal electric fields, such as an in-plane switching (IPS) liquid crystal display panel, a fringe field switching (FFS) liquid crystal display panel, a transverse bend alignment liquid crystal display panel (TBA) or an electrical optical compensation liquid crystal display panel, but not limited thereto. The pixel electrodes of the pixel structure of the display panel in the different embodiments of the present disclosure will be further illustrated as follows.

Figure 2:
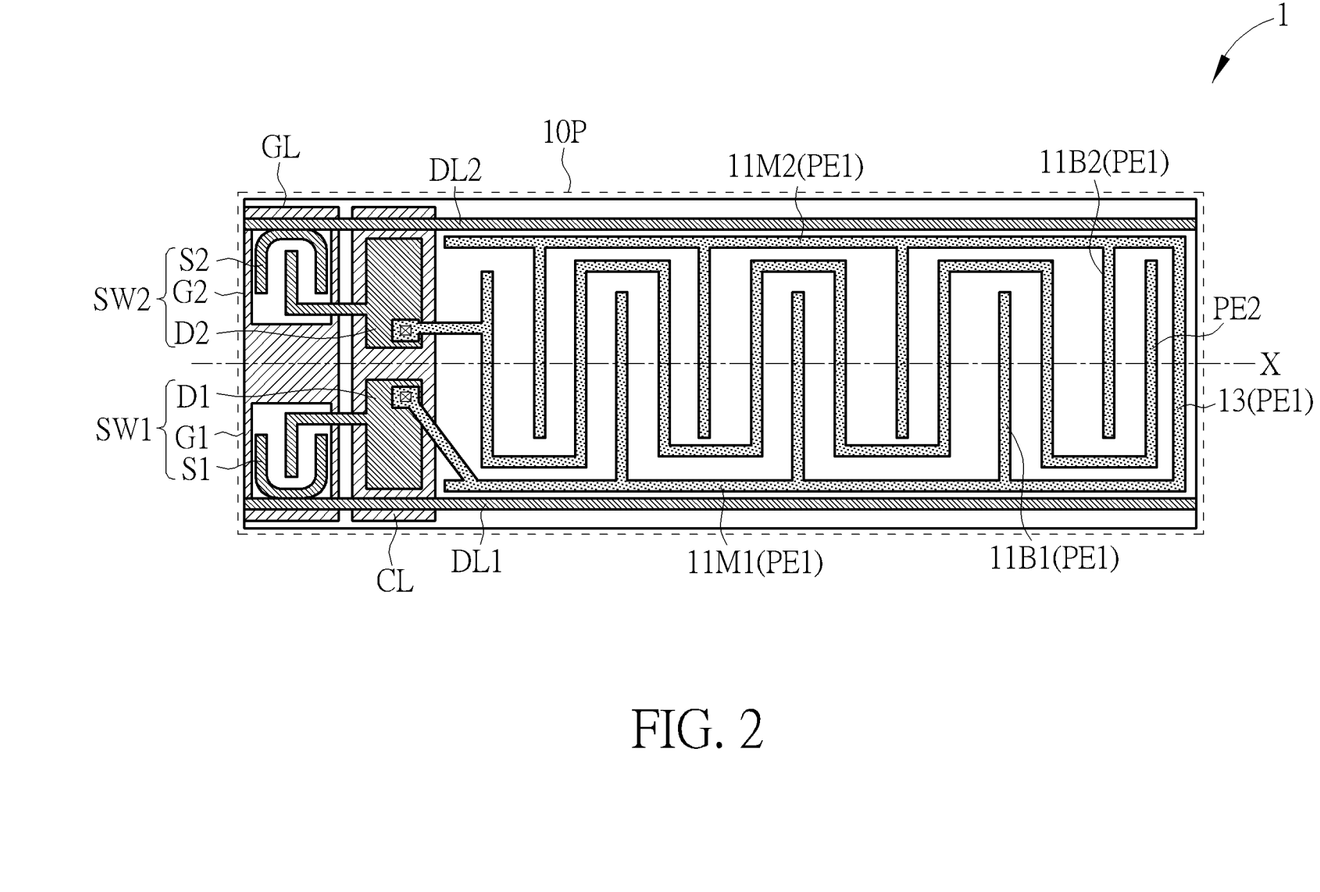
FIG. 2 is a schematic diagram illustrating the pixel structure of the display panel according to the first embodiment of the present disclosure.

Please refer to FIG. 2, and also refer to FIG. 1. FIG. 2 is a schematic diagram illustrating the pixel structure of the display panel according to the first embodiment of the present disclosure. As shown in FIGS. 1-2, the display panel in the embodiment includes a plurality of pixel structures 1 respectively disposed in the pixel regions 10P arranged in an array. For brevity purposes, only one of the signal pixel structures 1 is shown in the figures. In the pixel structure 1 of the display panel of this embodiment, the first pixel electrode PE1 includes a first main electrode 11M1, a second main electrode 11M2 and a connection electrode 13. The first main electrode 11M1 is substantially disposed adjacently to a side of the first data line DL1. The second main electrode 11M2 is substantially disposed adjacently to a side of the second data line DL2. From a top view, there may be a gap between the first main electrode 11M1 and the first data line DL1. In other cases, the first main electrode 11M1 is aligned to the edge of the first data line DL1. In other words, the edge of the first main electrode 11M1 is adjusted to match the edge of the first data line DL1 from the top view, or the first main electrode 11M1 may further extend to partially overlap the first data line DL1 from the top view. From a top view, there may be a gap between the second main electrode 11M2 and the second data line DL2. In other cases, the second main electrode 11M2 is aligned to the edge of the second data line DL2. In other words, the edge of the second main electrode 11M2 is adjusted to match the edge of the second data line DL2 from the top view, or the second main electrode 11M2 may further extend to partially overlap the second data line DL2 from the top view. The first main electrode 11M1 may be directly electrically connected to the first drain electrode D1. The second main electrode 11M2 may be directly electrically connected to the first main electrode 11M1 through the connection electrode 13. The first pixel electrode PE1 further includes a plurality of first branch electrodes 11B1 and a plurality of second branch electrodes 11B2. The first branch electrodes 11B1 are connected to the first main electrode 11M1. The second branch electrodes 11B2 are connected to the second main electrode 11M2. The first branch electrodes 11B1 and the second branch electrodes 11B2 are alternately arranged. Accordingly, a pathway with twists and turns but without branches is formed between the first branch electrodes 11B1 and the second branch electrodes 11B2. In this embodiment, all of the first branch electrodes 11B1 and the second branch electrodes 11B2 are disposed in both sides of the centerline X of both the first data line DL1 and the second data line DL2. More specifically speaking, the area of the first branch electrodes 11B1 disposed in both sides of the centerline X is substantially equal to each other. The area of the second branch electrodes 11B2 disposed in both sides of the centerline X is substantially equal to each other. For example, the first branch electrodes 11B1 and the second branch electrodes 11B2 may be stripe electrodes respectively. The first branch electrodes 11B1 and the second branch electrodes 11B2 are alternately arranged. The first branch electrodes 11B1 may be perpendicular to the first main electrode 11M1, and the second main electrode 11M2 may be perpendicular to the second branch electrodes 11B2, but not limited thereto. Preferably, the first branch electrodes 11B1 and the second branch electrodes 11B2 are substantially parallel to each other, but not limited thereto. The connection electrode 13 may be a stripe electrode and disposed in a side far from the first active switching device SW1 and the second active switching device SW2, but not limited thereto. Furthermore, the second pixel electrode PE2 may be a Z-shaped electrode and disposed zigzag in the pathway formed between the first branch electrodes 11B1 and the second branch electrodes 11B2. In other words, the second pixel electrode PE2 is disposed in both sides of the centerline X of both the first data line DL1 and the second data line DL2. The area of the second pixel electrode PE2 disposed in both sides of the centerline X is substantially equal to each other. The width of the first pixel electrode PE1 preferably equals the width of the second pixel electrode PE2, but not limited thereto.

With the above-mentioned design of the pixel electrodes, the capacitance of the first parasitic capacitor $C_{p1d1}$ between the first pixel electrode PE1 and the first data line DL1 substantially equals the capacitance of the second parasitic capacitor $C_{p1d2}$ between the first pixel electrode PE1 and the second data line DL2. The capacitance of the third parasitic capacitor $C_{p2d1}$ between the second pixel electrode PE2 and the first data line DL1 substantially equals the capacitance of the fourth parasitic capacitor $C_{p2d2}$ between the second pixel electrode PE2 and the second data line DL2. Accordingly, the issues, such as flickers or crosstalk, can be avoided effectively, the aperture ratio increases, and the display quality is enhanced. Moreover, in this embodiment, the gate line GL, the first gate electrode G1, the second gate electrode G2 and the storage capacitor line CL may be formed from the same patterned metal layer, such as a first metal layer, but not limited thereto. The shape and size of the storage capacitor line CL may be modified according to the requirement of the storage capacitor. For example, the storage capacitor line CL may be straight (stripe-shaped) or U-shaped. The first data line DL1, the second data line DL2, the first source electrode S1, the first drain electrode D1, the second source electrode S2 and the second drain electrode D2 may be formed from the same patterned metal layer, such as a second metal layer, but not limited thereto. The first pixel electrode PE1 and the second pixel electrode PE2 are transparent electrodes, such as the electrodes made of indium tin oxide (ITO), so the aperture ratio of the pixel structure 1 of the display panel of this embodiment is high. Additionally, the first pixel electrode PE1 and the second pixel electrode PE2 may be disposed on the same horizontal and formed from the same patterned conductive layer, such as an indium tin oxide (ITO) layer. In other cases, the first pixel electrode PE1 and the second pixel electrode PE2 may be disposed on different horizontal planes and formed from different patterned conductive layers.

Pixel structures of display panels are not restricted to the preceding embodiments in the present disclosure. Other embodiments or modifications will be detailed in the following description. In order to simplify and show the differences or modifications between the following embodiments and the above-mentioned embodiment, the same numerals denote the same components in the following description, and the similar parts are not detailed redundantly.

Figure 3:
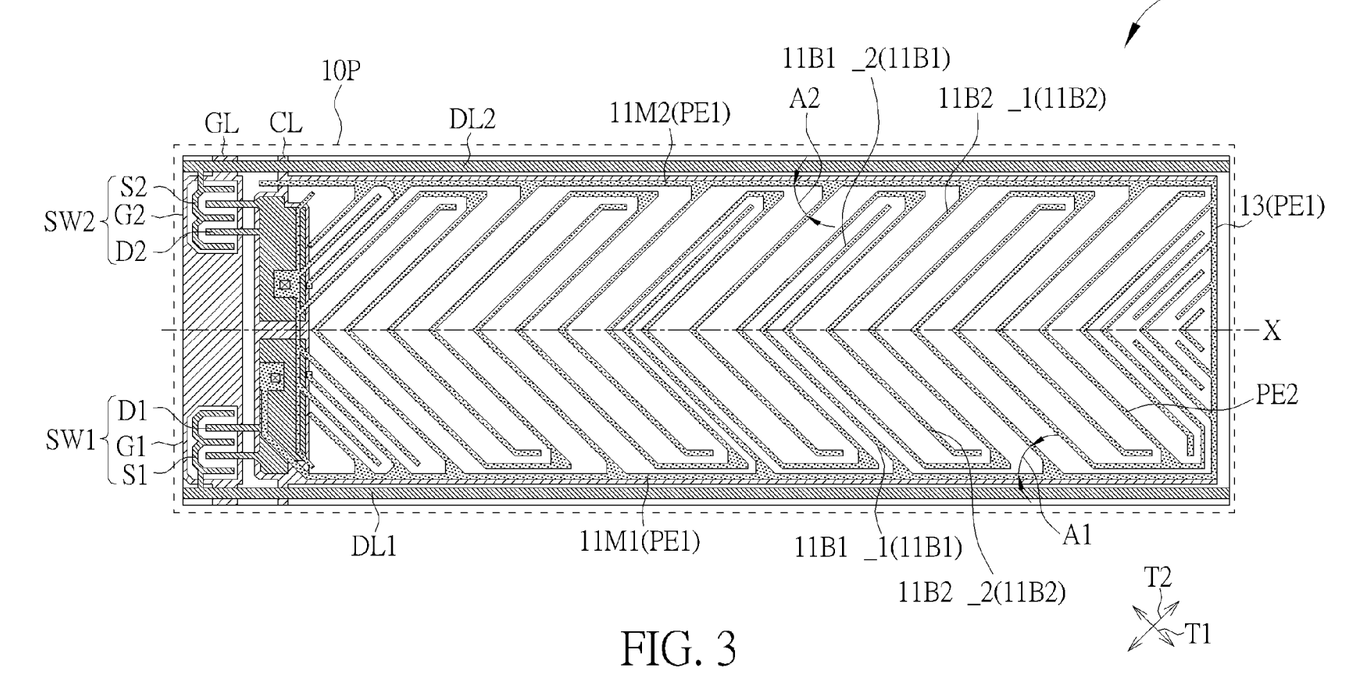
FIG. 3 is a schematic diagram illustrating the pixel structure of the display panel according to a variant of the first embodiment of the present disclosure.

Please refer to FIG. 3, and also refer to FIG. 1. FIG. 3 is a schematic diagram illustrating the pixel structure of the display panel according to a variant of the first embodiment of the present disclosure. As shown in FIG. 1 and FIG. 3, compared with the first embodiment, in the pixel structure 1' of the display panel of the variant embodiment, each of the first branch electrodes 11B1 includes a first stripe electrode 11B1_1 and a second stripe electrode 11B1_2. The first stripe electrode 11B1_1 is connected to the first main electrode 11M1 and extends along a first direction T1. The second stripe electrode 11B1_2 is connected to the first stripe electrode 11B1_1 and extends along a second direction T2. Each of the second branch electrodes 11B2 includes a third stripe electrode 11B2_1 and a fourth stripe electrode 11B2_2. The third stripe electrode 11B2_1 is connected to the second main electrode 11M2 and extends along the second direction T2. The fourth stripe electrode 11B2_2 is connected to the third stripe electrode 11B2_1 and extends along the first direction T1. The first direction T1 is different from the second direction T2. There are a first included angle A1 between the first direction T1 and the first main electrode 11M1, and a second included angle A2 between the second direction T2 and the second main electrode 11M2. The first included angle A1 and the second included angle A2 may be greater than 0 degrees and less than 180 degrees. The first stripe electrode 11B1_1 is parallel to the fourth stripe electrode 11B2_2, and the second stripe electrode 11B1_2 is parallel to the third stripe electrode 11B2_1, but not limited thereto. For example, each of the first branch electrodes 11B1 is substantially a V-shaped electrode, and each of the second branch electrodes 11B2 is substantially a V-shaped electrode, but not limited thereto. In this variant embodiment, the first branch electrodes 11B1 and the second branch electrodes 11B2 are symmetric with respect to the centerline X of both the first data line DL1 and the second data line DL2. Moreover, the second pixel electrode PE2 is disposed tortuously in the pathway formed between the first branch electrode 11B1 (i.e., the first stripe electrodes 11B1_1 and the second stripe electrode 11B1_2) and the second branch electrodes 11B2 (i.e., the third stripe electrode 11B2_1 and the fourth stripe electrode 11B2_2). The second pixel electrode PE2 is symmetric with respect to the centerline X of both the first data line DL1 and the second data line DL2. With the above-mentioned design of the pixel electrodes, the capacitance of the first parasitic capacitor $C_{p1d1}$ between the first pixel electrode PE1 and the first data line DL1 substantially equals the capacitance of the second parasitic capacitor $C_{p1d2}$ between the first pixel electrode PE1 and the second data line DL2. The capacitance of the third parasitic capacitor $C_{p2d1}$ between the second pixel electrode PE2 and the first data line DL1 substantially equals the capacitance of the fourth parasitic capacitor $C_{p2d2}$ between the second pixel electrode PE2 and the second data line DL2. Accordingly, the issues, such as flickers or crosstalk, can be avoided effectively, the aperture ratio increases, and the display quality is enhanced.

Figure 4:
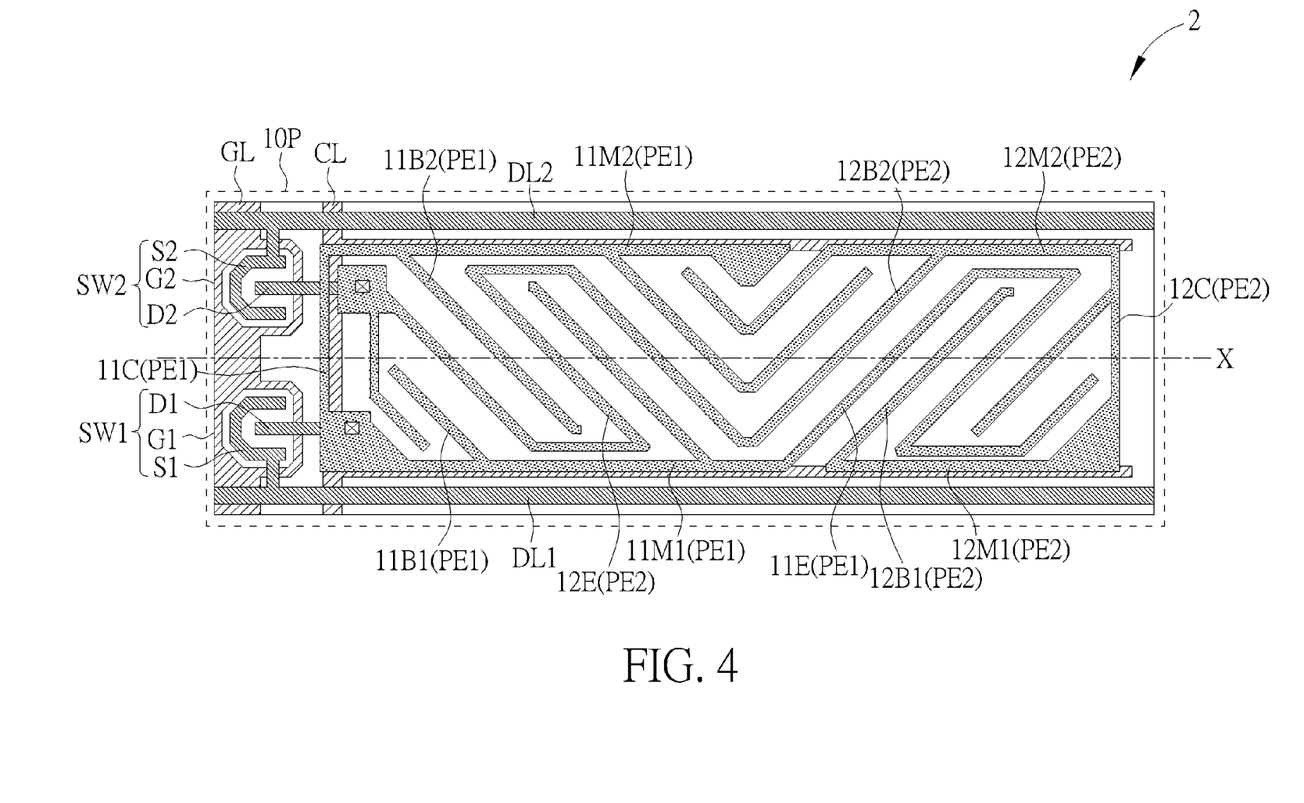
FIG. 4 is a schematic diagram illustrating the pixel structure of the display panel according to a second embodiment of the present disclosure.

Please refer to FIG. 4, and also refer to FIG. 1. FIG. 4 is a schematic diagram illustrating the pixel structure of the display panel according to a second embodiment of the present disclosure. As shown in FIG. 1 and FIG. 4, in the pixel structure 2 of the display panel in this embodiment, the first pixel electrode PE1 includes a first main electrode 11M1 and a second main electrode 11M2. The first main electrode 11M1 is substantially disposed adjacently to the first active switching device SW1 of the same pixel regions 10P and a side of a portion of the first data line DL1. The second main electrode 11M2 is connected to the first main electrode 11M1. The second main electrode 11M2 is substantially disposed adjacently to the second active switching device SW2 of the same pixel regions 10P and a side of a portion of the second data line DL2. The second pixel electrode PE2 includes a third main electrode 12M1 and a fourth main electrode 12M2. The third main electrode 12M1 is substantially disposed adjacently to a side of the other portion of the first data line DL1, which is away from the first active switching device SW1 of the same pixel regions 10P. The fourth main electrode 12M2 is connected to the third main electrode 12M1. The fourth main electrode 12M2 is substantially disposed adjacently to a side of the other portion of the second data line DL2, which is away from the second active switching device SW2 of the same pixel regions 10P. In this embodiment, the first main electrode 11M1, the second main electrode 11M2, the third main electrode 12M1, the fourth main electrode 12M2, the first data line DL1 and the second data line DL2 may be stripe electrodes respectively and substantially parallel to one another, but not limited thereto.

The first pixel electrode PE1 further includes a plurality of first branch electrodes 11B1, a plurality of second branch electrodes 11B2 and a first extension electrode 11E. The second pixel electrode PE2 further includes a plurality of third branch electrodes 12B1, a plurality of fourth branch electrodes 12B2 and a second extension electrode 12E. The first branch electrodes 11B1 are connected to the first main electrode 11M1. The second branch electrodes 11B2 are connected to the second main electrode 11M2. The first branch electrodes 11B1 and the second branch electrodes 11B2 are alternately arranged so as to form a pathway with twists and turns but without branches between the first branch electrodes 11B1 and the second branch electrodes 11B2. Preferably, the first branch electrodes 11B1 and the second branch electrodes 11B2 are parallel to one another, but not limited thereto. The third branch electrodes 12B1 are connected to the third main electrode 12M1. The fourth branch electrodes 12B2 are connected to the fourth main electrode 12M2. The third branch electrodes 12B1 and the fourth branch electrodes 12B2 are alternately arranged so as to form a pathway with twists and turns but without branches between the third branch electrodes 12B1 and the fourth branch electrodes 12B2. Preferably, the third branch electrodes 12B1 and the fourth branch electrodes 12B2 are parallel to one another, but not limited thereto. The first extension electrode 11E is connected to the first main electrode 11M1. The first extension electrode 11E is disposed tortuously in the pathway formed between the third branch electrodes 12B1 and the fourth branch electrodes 12B2. The second extension electrode 12E is connected to the fourth main electrode 12M2. The second extension electrode 12E is disposed tortuously in the pathway formed between the first branch electrodes 11B1 and the second branch electrodes 11B2. In this embodiment, the third main electrode 12M1, the fourth main electrode 12M2, the third branch electrodes 12B1 and the fourth branch electrodes 12B2 of the second pixel electrode PE2 are electrically connected to the second drain electrode D2 of the second active switching device SW2 through the second extension electrode 12E.

In addition, the first pixel electrode PE1 further includes a first connection electrode 11C. The first connection electrode 11C is connected to the first main electrode 11M1 and the second main electrode 11M2. The second pixel electrode PE2 further includes a second connection electrode 12C. The second connection electrode 12C is connected to the third main electrode 12M1 and the fourth main electrode 12M2. The first connection electrode 11C and the second connection electrode 12C may be stripe electrodes respectively. The first connection electrode 11C may be disposed in a side of the pixel regions 10P adjacent to both the first active switching device SW1 and the second active switching device SW2 so as to electrically connect the first main electrode 11M1 to the second main electrode 11M2. The second connection electrode 12C may be disposed in another side of the same pixel region 10P far from both the first active switching device SW1 and the second active switching device SW2 so as to electrically connect the third main electrode 12M1 to the fourth main electrode 12M2. In this embodiment, the first main electrode 11M1, the second main electrode 11M2, the first branch electrodes 11B1 and the second branch electrodes 11B2 of the first pixel electrode PE1 are electrically connected to the first drain electrode D1 of the first active switching device SW1 through the first connection electrode 11C.

In this embodiment, the length of the first main electrode 11M1 substantially equals the length of the second main electrode 11M2. The length of the fourth main electrode 12M2 substantially equals the length of the third main electrode 12M1. The length of the first main electrode 11M1 may equal the length of the third main electrode 12M1. In other words, the length of the first main electrode 11M1 and the length of the third main electrode 12M1 may be substantially equal to half of the length of the first data line DL1, but not limited thereto. In a variant embodiment, the ratio of the length of the first main electrode 11M1 to the length of the third main electrode 12M1 may be greater or less than 1.

With the above-mentioned design of the pixel electrodes, the capacitance of the first parasitic capacitor $C_{p1d1}$ between the first pixel electrode PE1 and the first data line DL1, the capacitance of the second parasitic capacitor $C_{p1d2}$ between the first pixel electrode PE1 and the second data line DL2, the capacitance of the third parasitic capacitor $C_{p2d1}$ between the second pixel electrode PE2 and the first data line DL1 and the capacitance of the fourth parasitic capacitor $C_{p2d2}$ between the second pixel electrode PE2 and the second data line DL2 are substantially equal to one another. As a result, the issues, such as flicker or crosstalk, can be avoided effectively, the aperture ratio increases, and the display quality is enhanced. Furthermore, in this embodiment, both the first pixel electrode PE1 and the second pixel electrode PE2 are transparent electrodes, such as the electrodes made of indium tin oxide (ITO), so the aperture ratio of the pixel structure 2 of the display panel of this embodiment is high. Additionally, the first pixel electrode PE1 and the second pixel electrode PE2 may be disposed on the same horizontal plane and formed from the same patterned conductive layer. In other cases, the first pixel electrode PE1 and the second pixel electrode PE2 may be disposed on different horizontal planes and formed from different patterned conductive layers. It is worth noting that the exact location of both the first pixel electrode PE1 and the second pixel electrode PE2 may be offset with respect to the first data line DL1 and the second data line DL2 because of misalignments. However, even when the first pixel electrode PE1 and the second pixel electrode PE2 are offset, the capacitance of the first parasitic capacitor $C_{p1d1}$ between the first pixel electrode PE1 and the first data line DL1 substantially equals the capacitance of the third parasitic capacitor $C_{p2d1}$ between the second pixel electrode PE2 and the first data line DL1. The capacitance of the fourth parasitic capacitor $C_{p2d2}$ between the second pixel electrode PE2 and the second data line DL2 substantially equals the capacitance of the second parasitic capacitor $C_{p1d2}$ between the first pixel electrode PE1 and the second data line DL2 Accordingly, the issues, such as flicker or crosstalk, can be avoided effectively.

Figure 5:
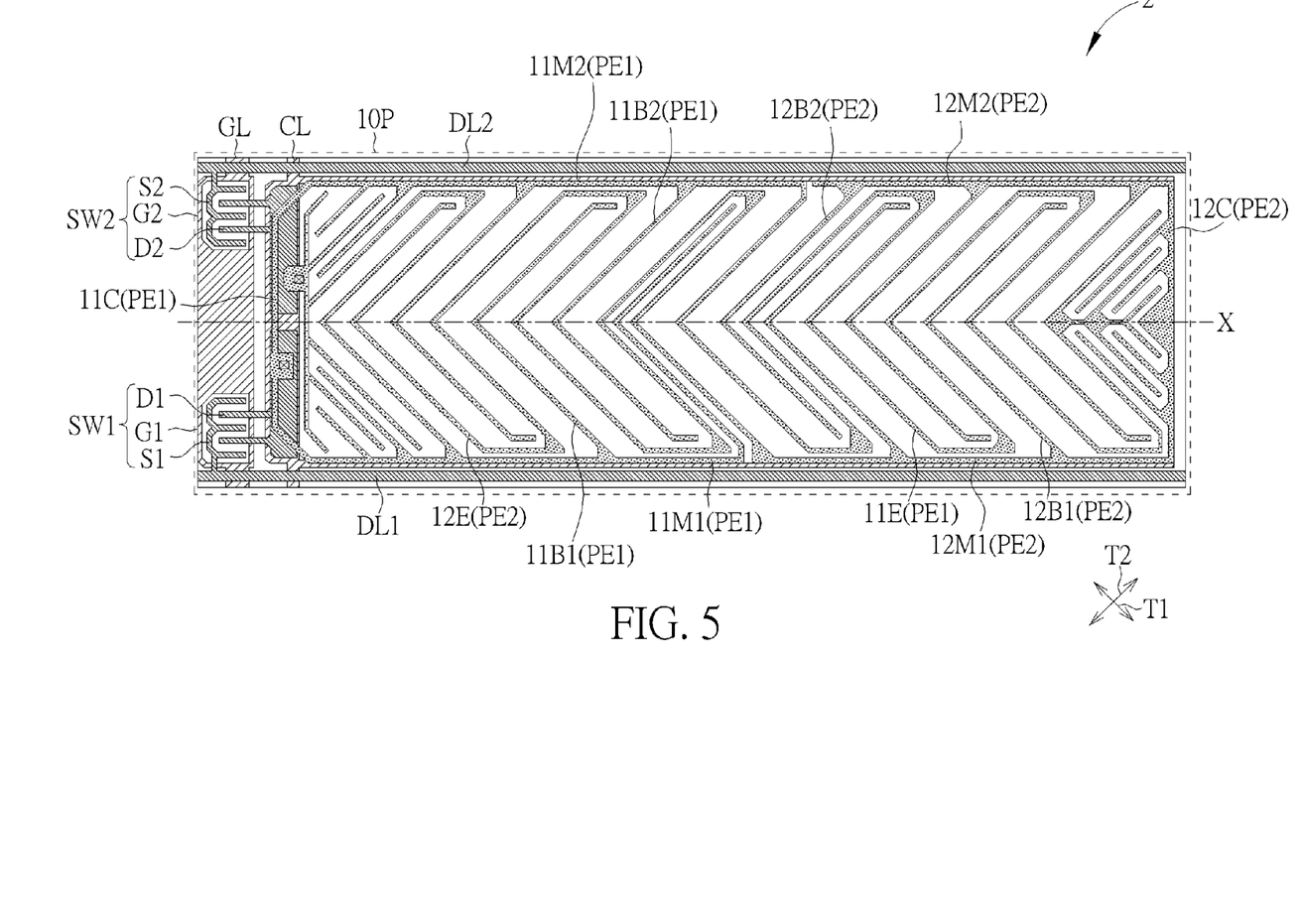
FIG. 5 is a schematic diagram illustrating the pixel structure of the display panel according to a variant of the second embodiment of the present disclosure.

Please refer to FIG. 5, and also refer to FIG. 1. FIG. 5 is a schematic diagram illustrating the pixel structure of the display panel according to a variant of the second embodiment of the present disclosure. As shown in FIG. 1 and FIG. 5, compared with the second embodiment, in the pixel structure 2' of the display panel of the variant embodiment, the length of the first main electrode 11M1 is substantially shorter than the length of the second main electrode 11M2. The length of the fourth main electrode 12M2 is substantially shorter than the length of the third main electrode 12M1. Therefore, the second main electrode 11M2 partially overlaps the third main electrode 12M1 in a direction parallel to the gate line GL. The design mentioned above is the modified design according to the consideration of the parasitic capacitor between the first data line DL1 and the first drain electrode D1 of the first active switching device SW1 and the parasitic capacitor between the second data line DL2 and the second drain electrode D2 of the second active switching device SW2. To be more specifically, because the first drain electrode D1 is electrically connected to the first pixel electrode PE1, the parasitic capacitor which is formed between the first drain electrode D1 and the first data line DL1 is also a portion of the first parasitic capacitor $C_{p1d1}$ between the first pixel electrode PE1 and the first data line DL1. Similarly, because the second drain electrode D2 is electrically connected to the second pixel electrode PE2, the parasitic capacitor which is formed between the second drain electrode D2 and the second data line DL2 is also a portion of the fourth parasitic capacitor $C_{p2d2}$ between the second pixel electrode PE2 and the second data line DL2. As a result, in order to equalize the capacitance of the first parasitic capacitor $C_{p1d1}$, the capacitance of the second parasitic capacitor $C_{p1d2}$, the capacitance of the third parasitic capacitor $C_{p2d1}$ and the capacitance of the fourth parasitic capacitor $C_{p2d2}$, the length of the second main electrode 11M2 must be longer than the first main electrode 11M1 so as to increase the capacitance of the second parasitic capacitor $C_{p1d2}$, and the length of the third main electrode 12M1 must be longer than the fourth main electrode 12M2 so as to increase the capacitance of the third parasitic capacitor $C_{p2d1}$. With the above-mentioned arrangement, the capacitance of the first parasitic capacitor $C_{p1d1}$, the capacitance of the second parasitic capacitor $C_{p1d2}$, the capacitance of the third parasitic capacitor $C_{p2d1}$ and the capacitance of the fourth parasitic capacitor $C_{p2d2}$ are substantially equal to one another. Moreover, the issues, such as flicker or crosstalk, can be avoided effectively. The length of the first main electrode 11M1, the length of the second main electrode 11M2, the length of the third main electrode 12M1 and the length of the fourth main electrode 12M2 may be appropriately modified according to the size of both the first drain electrode D1 and the second drain electrode D2, the distance between the first drain electrode D1 and the first data line DL1 and the distance between the second drain electrode D2 and the second data line DL2 so that the capacitance of the first parasitic capacitor $C_{p1d1}$, the capacitance of the second parasitic capacitor $C_{p1d2}$, the capacitance of the third parasitic capacitor $C_{p2d1}$ and the capacitance of the fourth parasitic capacitor $C_{p2d2}$ are substantially equal to one another.

To sum up, the pixel structure of the display panel in the present disclosure can balance the capacitive coupling effect, effectively improve the issues, such as flicker or crosstalk, and enhance the display quality.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A pixel structure of a display panel, comprising:
   a gate line;
   a first data line;
   a second data line;
   a first active switching device, comprising a first gate electrode, a first source electrode and a first drain electrode, wherein the first gate electrode is electrically connected to the gate line, and the first source electrode is electrically connected to the first data line;
   a second active switching device, comprising a second gate electrode, a second source electrode and a second drain electrode, wherein the second gate electrode is electrically connected to the gate line, and the second source electrode is electrically connected to the second data line;
   a first pixel electrode, electrically connected to the first drain electrode of the first active switching device, wherein the first pixel electrode comprises a first main electrode and a second main electrode, the first main electrode is substantially disposed adjacently to a side of the first data line, and the second main electrode is substantially disposed adjacently to a side of the second data line, and wherein the first pixel electrode further comprises a plurality of first branch electrodes and a plurality of second branch electrodes, the first branch electrodes are connected to the first main electrode, the second branch electrodes are connected to the second main electrode, the first branch electrodes and the second branch electrodes are alternately arranged, each of the first branch electrodes comprises a first stripe electrode and a second stripe electrode, the first stripe electrode is connected to the first main electrode and extends along a first direction, the second stripe electrode is connected to the first stripe electrode and extends along a second direction, each of the second branch electrodes comprises a third stripe electrode and a fourth stripe electrode, the third stripe electrode is connected to the second main electrode and extends along the second direction, the fourth stripe electrode is connected to the third stripe electrode and extends along the first direction, the first direction is different from the second direction, and there are a first included angle between the first direction and the first main electrode and a second included angle between the second direction and the second main electrode; and a second pixel electrode, electrically connected to the second drain electrode of the second active switching device, wherein the second pixel electrode is disposed between the first main electrode of the first pixel electrode and the second main electrode of the first pixel electrode, and the second pixel electrode is disposed tortuously between the first branch electrodes and the second branch electrodes.

2. The pixel structure of the display panel according to claim 1, wherein each of the first branch electrodes is substantially a V-shaped electrode and each of the second branch electrodes is substantially a V-shaped electrode.

3. The pixel structure of the display panel according to claim 1, wherein the first pixel electrode further comprises a connection electrode, and the connection electrode is connected to both the first main electrode and the second main electrode.

4. The pixel structure of the display panel according to claim 1, further comprising a first parasitic capacitor, a second parasitic capacitor, a third parasitic capacitor and a fourth parasitic capacitor, wherein the first parasitic capacitor is formed between the first pixel electrode and the first data line, the second parasitic capacitor is formed between the first pixel electrode and the second data line, the third parasitic capacitor is formed between the second pixel electrode and the first data line, the fourth parasitic capacitor is formed between the second pixel electrode and the second data line, a capacitance of the first parasitic capacitor substantially equals a capacitance of the second parasitic capacitor, and a capacitance of the third parasitic capacitor substantially equals a capacitance of the fourth parasitic capacitor.

5. A pixel structure of the display panel, comprising:
a gate line;
a first data line;
a second data line;
a first active switching device, comprising a first gate electrode, a first source electrode and a first drain electrode, wherein the first gate electrode is electrically connected to the gate line, and the first source electrode is electrically connected to the first data line;

a second active switching device, comprising a second gate electrode, a second source electrode and a second drain electrode, wherein the second gate electrode is electrically connected to the gate line, and the second source electrode is electrically connected to the second data line;

a first pixel electrode, electrically connected to the first drain electrode of the first active switching device, wherein the first pixel electrode comprises a first main electrode and a second main electrode, the first main electrode is substantially disposed adjacently to both the first active switching device and a side of a portion of the first data line, and the second main electrode is substantially disposed adjacently to both the second active switching device and a side of a portion of the second data line; and a second pixel electrode, electrically connected to the second drain electrode of the second active switching device, wherein the second pixel electrode comprises a third main electrode and a fourth main electrode, the third main electrode is substantially disposed adjacently to a side of the other portion of the first data line away from the first active switching device, and the fourth main electrode is substantially disposed adjacently to a side of the other portion of the second data line away from the second active switching device.

6. The pixel structure of the display panel according to claim 5, wherein the first main electrode, the second main electrode, the third main electrode, the fourth main electrode, the first data line and the second data line are disposed parallel to one another.

7. The pixel structure of the display panel according to claim 5, wherein a length of the first main electrode substantially equals a length of the second main electrode, and a length of the fourth main electrode substantially equals a length of the third main electrode.

8. The pixel structure of the display panel according to claim 5, wherein a length of the first main electrode is less than a length of the second main electrode, a length of the fourth main electrode is less than a length of the third main electrode, and the second main electrode partially overlaps the third main electrode in a direction parallel to the gate line.

9. The pixel structure of the display panel according to claim 5, wherein the first pixel electrode further comprises a plurality of first branch electrodes and a plurality of second branch electrodes, the first branch electrodes are connected to the first main electrode, the second branch electrodes are connected to the second main electrode, the first branch electrodes and the second branch electrodes are alternately arranged, the second pixel electrode further comprises a plurality of third branch electrodes and a plurality of fourth branch electrodes, the third branch electrodes are connected to the third main electrode, the fourth branch electrodes are connected to the fourth main electrode, and the third branch electrodes and the fourth branch electrodes are alternately arranged.

10. The pixel structure of the display panel according to claim 9, wherein the first pixel electrode further comprises a first extension electrode connected to the first main electrode, the first extension electrode extends tortuously between the third branch electrodes and the fourth branch electrodes, the second pixel electrode further comprises a second extension electrode connected to the fourth main electrode, the second extension electrode extends tortuously between the first branch electrodes and the second branch electrodes.

11. The pixel structure of the display panel according to claim 5, wherein the first pixel electrode further comprises a first connection electrode, the first connection electrode is connected to the first main electrode and the second main electrode, and the second pixel electrode further comprises a second connection electrode, and the second connection electrode is connected to the third main electrode and the fourth main electrode.

12. The pixel structure of the display panel according to claim 5, further comprising a first parasitic capacitor, a second parasitic capacitor, a third parasitic capacitor and a fourth parasitic capacitor, wherein the first parasitic capacitor is formed between the first pixel electrode and the first data line, the second parasitic capacitor is formed between the first pixel electrode and the second data line, the third parasitic capacitor is formed between the second pixel electrode and the first data line, the fourth parasitic capacitor is formed between the second pixel electrode and the second data line, a capacitance of the first parasitic capacitor, a capacitance of the second parasitic capacitor, a capacitance of the third parasitic capacitor and a capacitance of the fourth parasitic capacitor are substantially equal to one another.

13. A pixel structure of a display panel, comprising:
a gate line;
a first data line;
a second data line;
a first active switching device, comprising a first gate electrode, a first source electrode and a first drain electrode, wherein the first gate electrode is electrically connected to the gate line, and the first source electrode is electrically connected to the first data line;
a second active switching device, comprising a second gate electrode, a second source electrode and a second drain electrode, wherein the second gate electrode is electrically connected to the gate line, and the second source electrode is electrically connected to the second data line;
a first pixel electrode, electrically connected to the first drain electrode of the first active switching device, wherein the first pixel electrode comprises a first main electrode and a second main electrode, the first main electrode is substantially disposed adjacently to a side of the first data line, and the second main electrode is substantially disposed adjacently to a side of the second data line, and wherein the first pixel electrode further comprises a plurality of first branch electrodes and a plurality of second branch electrodes, the first branch electrodes are connected to the first main electrode, the first branch electrode and the first main electrode have an included angle, the second branch electrodes are connected to the second main electrode, the second branch electrode and the second main electrode have an included angle, and the first branch electrodes and the second branch electrodes are alternately arranged; and
a second pixel electrode, electrically connected to the second drain electrode of the second active switching device, wherein the second pixel electrode is disposed between the first main electrode of the first pixel electrode and the second main electrode of the first pixel electrode, and the second pixel electrode is disposed tortuously between the first branch electrodes and the second branch electrodes.

14. The pixel structure of the display panel according to claim 13, wherein the first branch electrodes are perpendicular to the first main electrode, and the second branch electrodes are perpendicular to the second main electrode.

15. The pixel structure of the display panel according to claim 13, wherein the first branch electrodes are substantially parallel to the second branch electrodes.

16. The pixel structure of the display panel according to claim 13, wherein the first pixel electrode further comprises a connection electrode, and the connection electrode is connected to both the first main electrode and the second main electrode.

17. The pixel structure of the display panel according to claim 13, further comprising a first parasitic capacitor, a second parasitic capacitor, a third parasitic capacitor and a fourth parasitic capacitor, wherein the first parasitic capacitor is formed between the first pixel electrode and the first data line, the second parasitic capacitor is formed between the first pixel electrode and the second data line, the third parasitic capacitor is formed between the second pixel electrode and the first data line, the fourth parasitic capacitor is formed between the second pixel electrode and the second data line, a capacitance of the first parasitic capacitor substantially equals a capacitance of the second parasitic capacitor, and a capacitance of the third parasitic capacitor substantially equals a capacitance of the fourth parasitic capacitor.

* * * * *